United States Patent
Yeh et al.

(10) Patent No.: US 8,796,772 B2
(45) Date of Patent: Aug. 5, 2014

(54) PRECISION RESISTOR FOR NON-PLANAR SEMICONDUCTOR DEVICE ARCHITECTURE

(71) Applicants: Jeng-Ya D. Yeh, Portland, OR (US); Peter J. Vandervoorn, Hillsboro, OR (US); Walid M. Hafez, Portland, OR (US); Chia-Hong Jan, Portland, OR (US); Curtis Tsai, Beaverton, OR (US); Joodong Park, Portland, OR (US)

(72) Inventors: Jeng-Ya D. Yeh, Portland, OR (US); Peter J. Vandervoorn, Hillsboro, OR (US); Walid M. Hafez, Portland, OR (US); Chia-Hong Jan, Portland, OR (US); Curtis Tsai, Beaverton, OR (US); Joodong Park, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 9 days.

(21) Appl. No.: 13/625,698

(22) Filed: Sep. 24, 2012

(65) Prior Publication Data
US 2014/0084381 A1    Mar. 27, 2014

(51) Int. Cl.
*H01L 21/70* (2006.01)

(52) U.S. Cl.
USPC .......... 257/350; 257/358; 257/E21.006; 257/E21.703; 257/E27.016; 257/E27.112; 257/379; 257/380; 257/383

(58) Field of Classification Search
CPC . H01L 27/0629; H01L 28/20; H01L 27/0802; H01L 21/82; H01L 21/823842
USPC .......... 257/E21.703, E27.016, E21.004, 257/E27.112, 379, 380, 383, 350, 358
See application file for complete search history.

(56) References Cited

U.S. PATENT DOCUMENTS

| | | | |
|---|---|---|---|
| 7,397,087 B2* | 7/2008 | Chinthakindi et al. | 257/350 |
| 7,985,639 B2* | 7/2011 | Johnson et al. | 438/197 |
| 2010/0301417 A1* | 12/2010 | Cheng et al. | 257/355 |
| 2012/0175749 A1* | 7/2012 | Haensch et al. | 257/623 |
| 2013/0161694 A1* | 6/2013 | Adam et al. | 257/192 |
| 2013/0241001 A1* | 9/2013 | Chen et al. | 257/380 |
| 2013/0307076 A1* | 11/2013 | Cheng et al. | 257/350 |
| 2014/0054706 A1* | 2/2014 | Liu et al. | 257/351 |

* cited by examiner

*Primary Examiner* — Matthew W Such
*Assistant Examiner* — Ali Naraghi
(74) *Attorney, Agent, or Firm* — Blakely, Sokoloff, Taylor & Zafman LLP

(57) ABSTRACT

Precision resistors for non-planar semiconductor device architectures are described. In a first example, a semiconductor structure includes first and second semiconductor fins disposed above a substrate. A resistor structure is disposed above the first semiconductor fin but not above the second semiconductor fin. A transistor structure is formed from the second semiconductor fin but not from the first semiconductor fin. In a second example, a semiconductor structure includes first and second semiconductor fins disposed above a substrate. An isolation region is disposed above the substrate, between the first and second semiconductor fins, and at a height less than the first and second semiconductor fins. A resistor structure is disposed above the isolation region but not above the first and second semiconductor fins. First and second transistor structures are formed from the first and second semiconductor fins, respectively.

24 Claims, 21 Drawing Sheets

PRECISION RESISTOR FOR NON-PLANAR SEMICONDUCTOR DEVICE ARCHITECTURE

TECHNICAL FIELD

Embodiments of the invention are in the field of semiconductor devices and processing and, in particular, precision resistors for non-planar semiconductor device architectures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the improved short-channel behavior of tri-gate transistors.

Scaling multi-gate transistors has not been without consequence, however. As the dimensions of these fundamental building blocks of microelectronic circuitry are reduced and as the sheer number of fundamental building blocks fabricated in a given region is increased, the constraints on including passive features among active devices have increased.

DESCRIPTION OF THE EMBODIMENTS

Figure 1A:
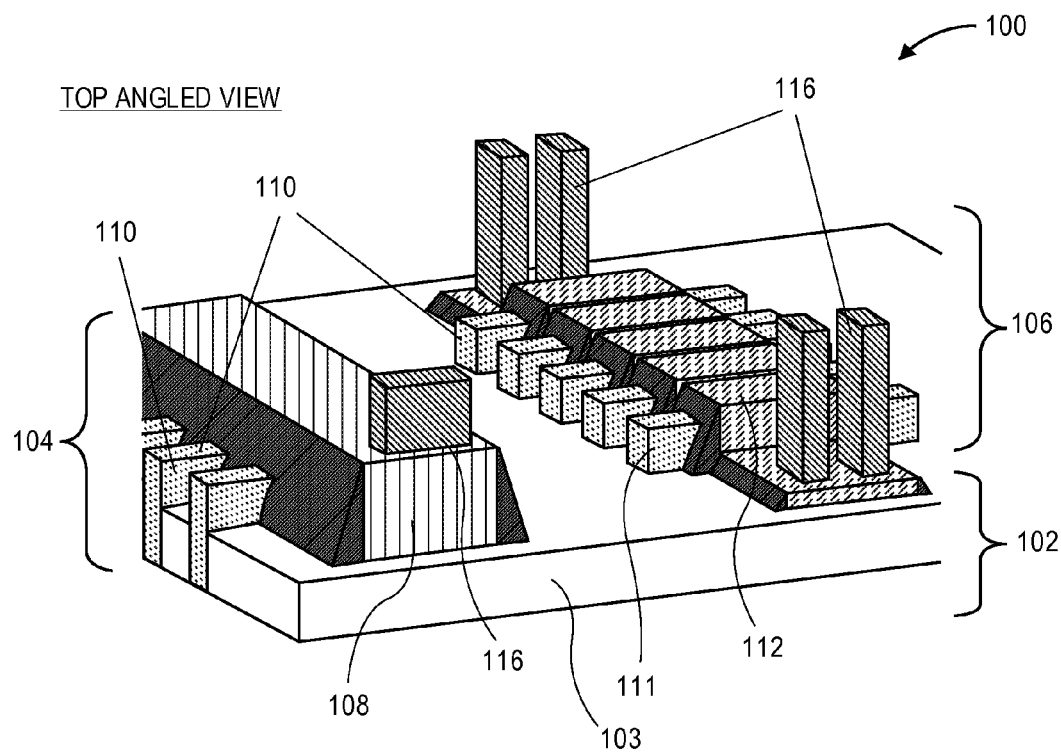
FIG. 1A illustrates a top angled view and a cross-sectional view of a precision resistor for a non-planar semiconductor device architecture, in accordance with an embodiment of the present invention.
Figure 1A:
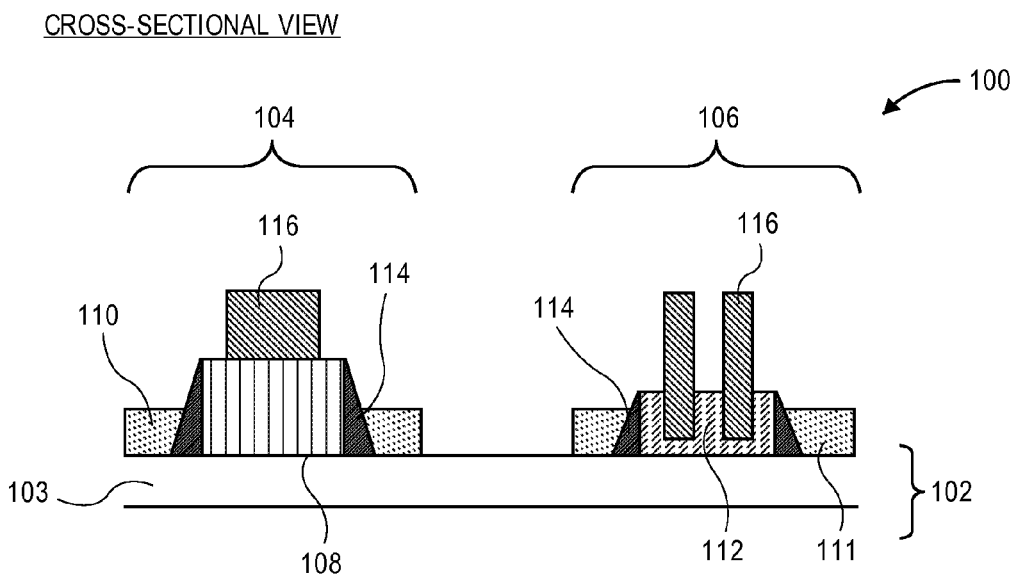

Precision resistors for non-planar semiconductor device architectures are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Gate electrodes were initially formed from metal (e.g., aluminum). However, for many technology nodes, a Metal-Oxide-Semiconductor Field Effect Transistor (MOSFET) had included a gate electrode that was fabricated from polysilicon so as to permit ion implantation (e.g., to customize doping to N- or P-type in the same circuit) and silicidation (to reduce contact resistance). Consequently, a resistor associated with the MOSFET in a circuit was also fabricated with polysilicon. A so-called "gate-first" process sequence was universally practiced so as to permit blanket deposition of the polysilicon, plasma etch-defined gate lengths, lightly-doped tip regions, dielectric sidewall spacers, and self-aligned source/drain (i.e., to the gate electrode).

As dimensions of the MOSFET continued to be scaled down in recent technology nodes, polysilicon depletion became an increasingly severe problem. As a result, gate electrodes are now being formed from metal again. However, gate electrodes are typically no longer formed strictly from aluminum. In order to achieve desired work functions, the gate electrodes are now usually formed from a transition metal, an alloy of transition metals, or a transition metal nitride. However, adoption of the metal gate also provided advantages to an alternative so-called "gate-last" process. One implementation of the gate-last process involved a so-called "replacement gate" process which allowed use of different metals for the N-FET and P-FET in the circuit. When the material in the gate electrode was changed from polysilicon back to metal, the material in the resistor was also changed from polysilicon back to metal. Unfortunately, metal resistors often suffer from high process variability and a poor temperature coefficient. Thus, it would be desirable to form the resistor with polysilicon again. However, such a change causes many challenges in process integration particularly for, e.g., non-planar architectures such as trigate process architectures.

Thus, in accordance with one or more embodiments of the present invention, precision polysilicon resistor formation methods on non-planar trigate high-k/metal gate technologies are described. By contrast, other approaches for fabricating resistors for use with trigate high-k/metal gate technology have included the fabrication of tungsten trench resistors (TCN) and tungsten gate contact resistors (GCN) which may be subject to very high variability due to tungsten polishing processing. Such variability may result in I/O functionality issues. Tungsten may also exhibit undesired material characteristics and variation with temperature (e.g., poor temperature coefficients).

Polysilicon resistors used in previous planar oxide/poly gate technologies may be a preferred option for precision resistor formation. The integration of the polysilicon and metal-gate material systems, however, is difficult with in a trigate high-k/metal gate process technology, e.g., particularly when using a replacement gate process flow. Accordingly, one or more embodiments of the present invention are directed to an integration scheme for fabricating both planar and non-planar polysilicon resistors in a non-planar device (e.g., trigate) architecture. One or more, if not all, of the approaches described herein may be integrated monolithically with a trigate high-k/metal gate transistor fabrication flow. Such integration may enable exploitation of superior characteristics of precision polysilicon resistors, e.g., versus tungsten resistors, with improvements in variability reduction, temperature coefficient and voltage coefficient improvements.

A non-planar polysilicon resistor may be included as an embedded polysilicon resistor with a non-planar architecture. In an embodiment, reference to a non-planar resistor is used herein to describe a resistor having a resistive layer formed over one or more fins protruding from a substrate. As an example, FIG. 1A illustrates a top angled view and a cross-sectional view of a precision resistor for a non-planar semiconductor device architecture, in accordance with an embodiment of the present invention.

Referring to both views of FIG. 1A, a semiconductor structure 100 includes a substrate 102 (only partially shown) having a non-planar device 104 and a non-planar resistor 106 formed on an isolation layer 103. Non-planar device 104 includes a gate stack 108, e.g., a metal gate/high-k gate dielectric gate stack. The gate stack 108 is formed over a first plurality of fins 110. Non-planar resistor 106 includes a non-planar semiconductor layer 112 formed over a second plurality of fins 111. Both devices include spacers 114 and contacts 116.

In an embodiment, the first and second pluralities of fins 110 and 111 are formed from a bulk substrate 102, as depicted in FIG. 1A. In one such example, bulk substrate 102 and, hence, the pluralities of fins 110 and 111 may be composed of a semiconductor material that can withstand a manufacturing process and in which charge can migrate. In an embodiment, bulk substrate 102 is composed of a crystalline silicon, silicon/germanium or germanium layer doped with a charge carrier, such as but not limited to phosphorus, arsenic, boron or a combination thereof. In one embodiment, the concentration of silicon atoms in bulk substrate 102 is greater than 97%. In another embodiment, bulk substrate 102 is composed of an epitaxial layer grown atop a distinct crystalline substrate, e.g. a silicon epitaxial layer grown atop a boron-doped bulk silicon mono-crystalline substrate. Bulk substrate 102 may alternatively be composed of a group III-V material. In an embodiment, bulk substrate 102 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 102 is composed of a III-V material and the charge-carrier dopant impurity atoms are ones such as, but not limited to, carbon, silicon, germanium, oxygen, sulfur, selenium or tellurium. In an embodiment, bulk substrate 102 and, hence, the pluralities of fins 110 and 111 is undoped or only lightly doped. In an embodiment, at least a portion of the pluralities of fins 110 and 111 is strained.

Alternatively, the substrate 102 includes an upper epitaxial layer and a lower bulk portion, either of which may be composed of a single crystal of a material which may include, but is not limited to, silicon, germanium, silicon-germanium or a III-V compound semiconductor material. An intervening insulator layer composed of a material which may include, but is not limited to, silicon dioxide, silicon nitride or silicon oxy-nitride may be disposed between the upper epitaxial layer and the lower bulk portion.

Isolation layer 103 may be composed of a material suitable to ultimately electrically isolate, or contribute to the isolation of, a permanent gate structure from an underlying bulk substrate. For example, in one embodiment, the isolation dielectric layer 103 is composed of a dielectric material such as, but not limited to, silicon dioxide, silicon oxy-nitride, silicon nitride, or carbon-doped silicon nitride. It is to be understood that a global layer may be formed and then recessed to ultimately expose the active portions of the pluralities of fins 110 and 111.

In an embodiment, the non-planar device 104 is a non-planar device such as, but not limited to, a fin-FET or a tri-gate device. In such an embodiment, a semiconducting channel region of the non-planar device 104 is composed of or is formed in a three-dimensional body. In one such embodiment, the gate stack 108 surrounds at least a top surface and a pair of sidewalls of the three-dimensional body, as depicted in FIG. 1A. In another embodiment, at least the channel region is made to be a discrete three-dimensional body, such as in a gate-all-around device. In one such embodiment, the gate electrode stack 108 completely surrounds the channel region.

As mentioned above, in an embodiment, the semiconductor devices 104 includes a gate stack 108 at least partially surrounding a portion of the non-planar device 104. In one such embodiment, gate stack 108 includes a gate dielectric layer and a gate electrode layer (not shown individually). In an embodiment, the gate electrode of gate stack 108 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 102. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode of gate stack 108 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

Non-planar resistor 106 includes non-planar semiconductor layer 112 to provide a precise resistance for resistor 106. In an embodiment, the semiconductor layer 112 is formed conformal with the plurality of fins 111. In one such embodiment, a dielectric layer (not shown) isolates the semiconductor layer 112 from the plurality of fins 111. In an embodiment, the semiconductor layer 112 is composed of a layer of polycrystalline silicon. In one embodiment, the polycrystalline silicon has a grain size of approximately 20 nanometers. In a specific such embodiment, the polycrystalline silicon is doped with boron with a dose approximately in the range of 1E15-1E17 atoms/cm$^2$. In an embodiment, the semiconductor layer 112 has a resistance that is essentially independent of temperature, particularly over the working temperature of the non-planar resistor 106.

In an embodiment, the spacers 114 are composed of an insulative dielectric material such as, but not limited to, silicon dioxide, silicon oxy-nitride or silicon nitride. In an embodiment, contacts 116 are fabricated from a metal species. The metal species may be a pure metal, such as nickel or cobalt, or may be an alloy such as a metal-metal alloy or a metal-semiconductor alloy (e.g., such as a silicide material).

In another aspect, a planar polysilicon resistor may be included with a non-planar architecture. In an embodiment, reference to a planar resistor is used herein to describe a resistor having a resistive layer formed adjacent to, but not over, one or more fins protruding from a substrate. As an example, FIG. 1B illustrates a cross-sectional view of a precision resistor for a non-planar semiconductor device architecture, in accordance with another embodiment of the present invention.

Figure 1B:
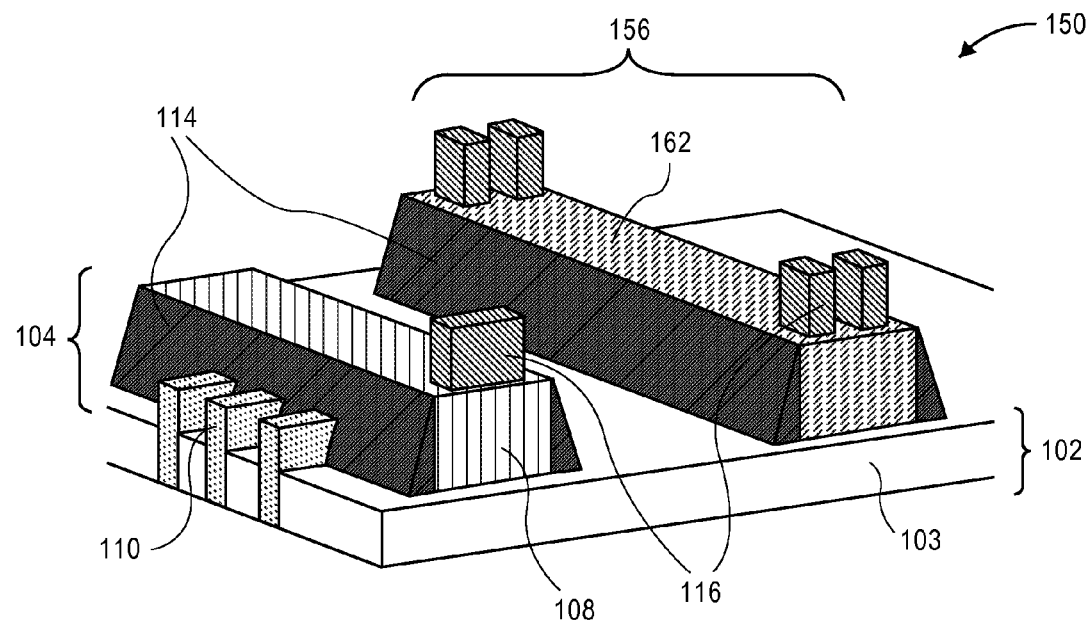
FIG. 1B illustrates a cross-sectional view of a precision resistor for a non-planar semiconductor device architecture, in accordance with another embodiment of the present invention.

Referring to FIG. 1B, a semiconductor structure 150 includes a substrate 102 (only partially shown) having a non-planar device 104 and a planar resistor 156 formed on an isolation layer 103. Non-planar device 104 includes a gate stack 108, e.g., a metal gate/high-k gate dielectric gate stack. The gate stack 108 is formed over a plurality of fins 110. Planar resistor 156 includes a planar semiconductor layer 162 formed over isolation layer 103. Both devices include spacers 114 and contacts 116.

Planar resistor 156 includes planar semiconductor layer 162 to provide a precise resistance for resistor 156. In an embodiment, the semiconductor layer 162 is composed of a layer of polycrystalline silicon. In one embodiment, the polycrystalline silicon has a grain size of approximately 20 nanometers. In a specific such embodiment, the polycrystalline silicon is doped with boron with a dose approximately in the range of 1E15-1E17 atoms/cm$^2$. In an embodiment, the semiconductor layer 162 has a resistance that is essentially independent of temperature, particularly over the working temperature of the planar resistor 156. The other features of FIG. 1b may be composed of materials similar to those described for FIG. 1A.

One or more embodiments of the present invention address suitable properties of a precision resistor. For example, in an embodiment, a precision resistor described herein is compatible with current and future process technologies, e.g., the precision resistor structures detailed are compatible with a trigate high-k/metal gate process flow where polysilicon is sacrificial and replaced with a metal gate architecture on a non-planar trigate process. In an embodiment, good resistor characteristics are provided, e.g., a non-planar integration scheme provides the advantages of larger effective width and length by utilizing the 3-dimensional wafer topology of a trigate process. Hence, a precision resistor fabricated accordingly may provide increased resistance uniformity and matching characteristics at a given resistor area. In an embodiment, a polysilicon resistor described herein provides better, e.g., reduced, temperature coefficients and voltage coefficients compared with other types of resistors.

By contrast, previous polysilicon resistors include the BSR (blocking salicide resistor) which integrates a poly resistor and a poly-gate transistor, and EPR (embedded poly resistor) which integrates a poly resistor with a planar HiK-metal gate transistor. Unlike the BSR and EPR resistors, precision resistors according to embodiments described herein may be fabricated for a non-planar embedded precision polysilicon resistor integration scheme. The approaches for fabrication described herein may enable a process flow to modularly integrate a polysilicon resistor on a trigate high-k/metal gate technology with minimal process cost.

Described below are multiple approaches to forming precision polysilicon resistors in a high-k/metal gate technology. As an example of embodiments contemplated herein, the following fabrication methods are detailed: (1) TPR (Trigate non-planar Poly Resistor+Trigate HKMG transistor) (a) dual poly deposition resistor, (b) buried hardmask stacked poly resistor, (c) recessed poly resistor (CPR), (d) selectively implanted poly resistor (NPR), and (2) MPR (masked planar poly resistor+Trigate HKMG transistor).

Regarding approaches of the type (I) above, in an embodiment, a precision resistor is fabricated from polysilicon material with a silicide connected to a tungsten contact. Features of such integration schemes include, but are not limited to, (1) polysilicon wraps around a recessed shallow trench isolation (STI) surface and elevated diffusion fin structures to provide larger effective length/width at a given area. The thin and recessed poly on the lower plane (non-planer scheme) may preserve the polysilicon resistor to be intact after multiple polish processes that may be necessary in the HiK-metal gate CMOS process. (2) The preserved poly silicon may be integrated with any suitable silicide process to ensure low contact resistance.

Figure 2A:
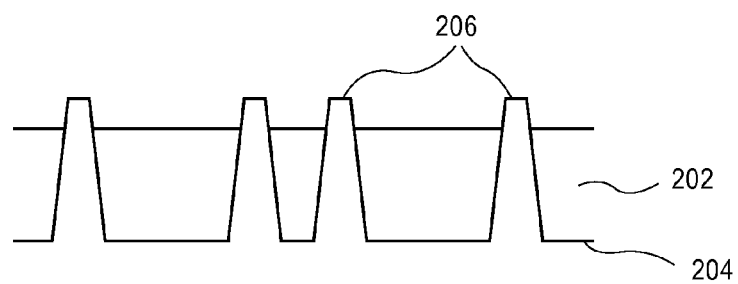
FIGS. 2A-2K illustrate cross-sectional views representing various operations in a method of fabricating a precision resistor for a non-planar semiconductor device architecture, in accordance with an embodiment of the present invention.
Figure 2B:
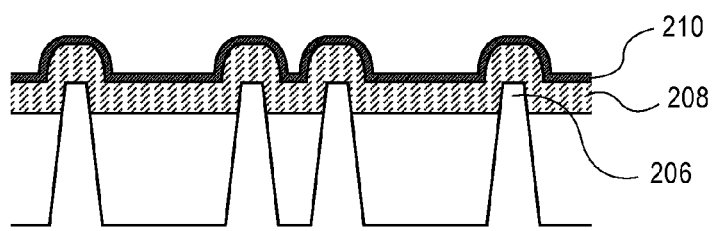
Figure 2C:
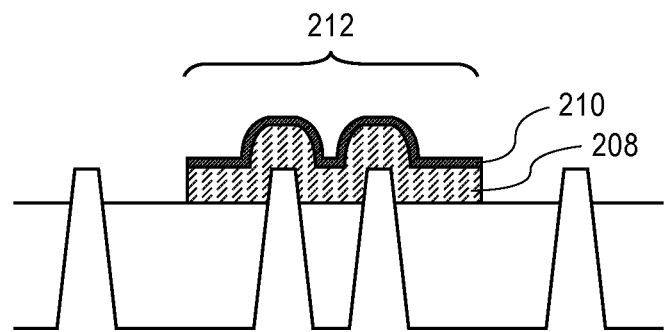
Figure 2D:
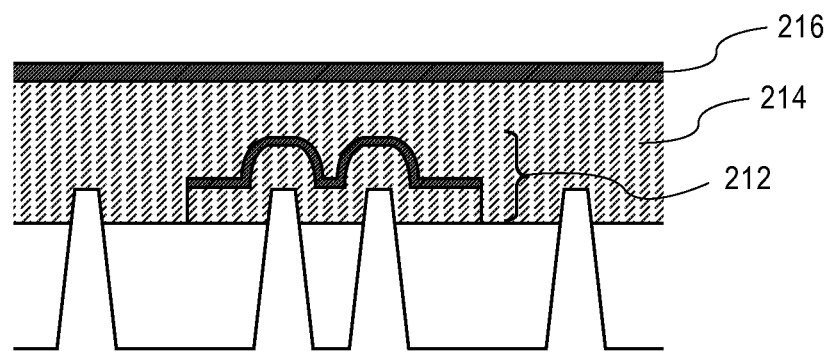
Figure 2E:
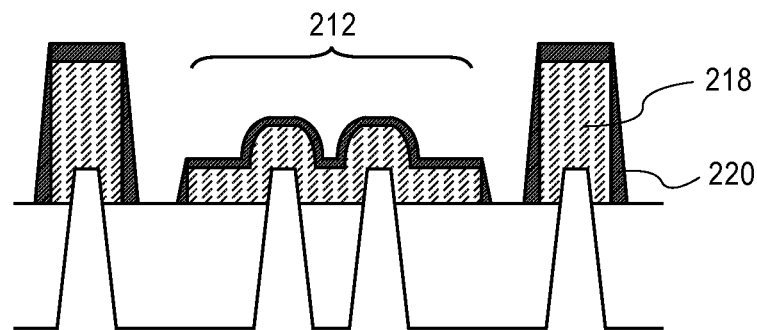
Figure 2F:
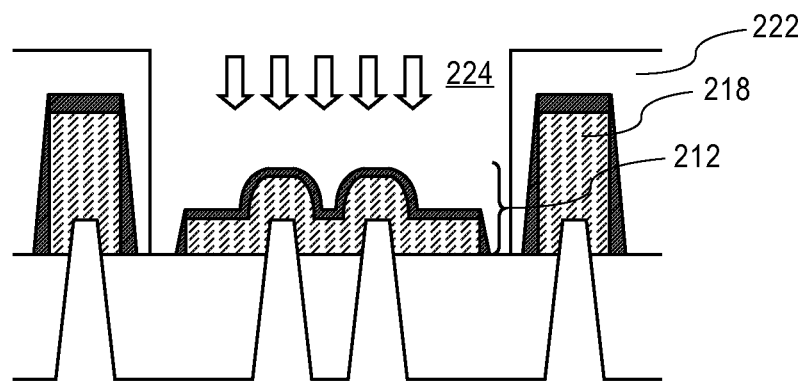
Figure 2G:
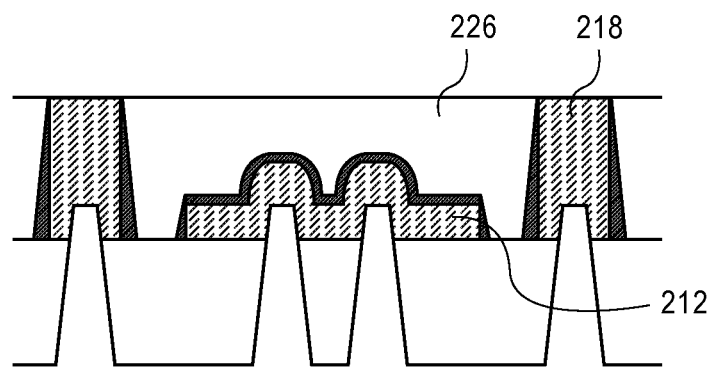
Figure 2H:
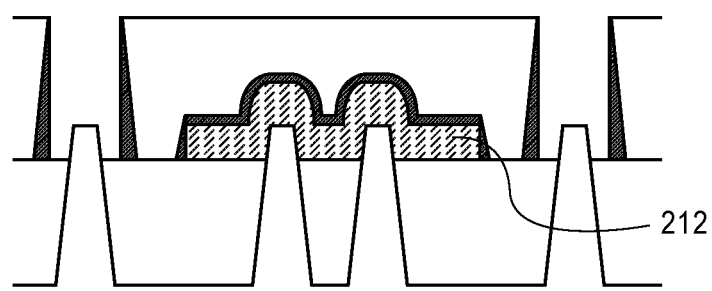
Figure 2I:
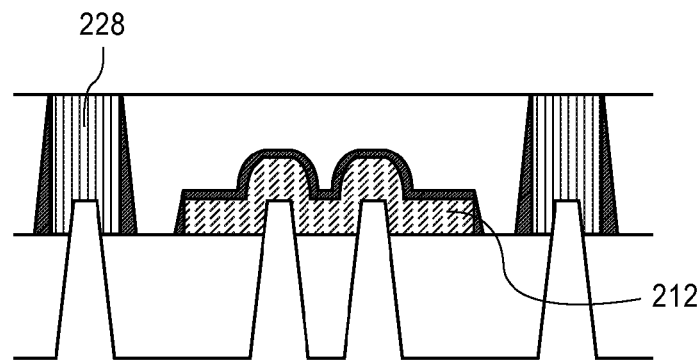
Figure 2J:
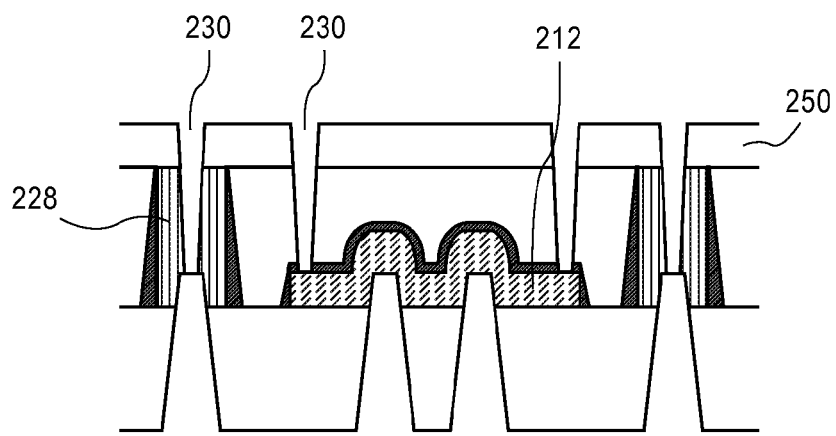
Figure 2K:
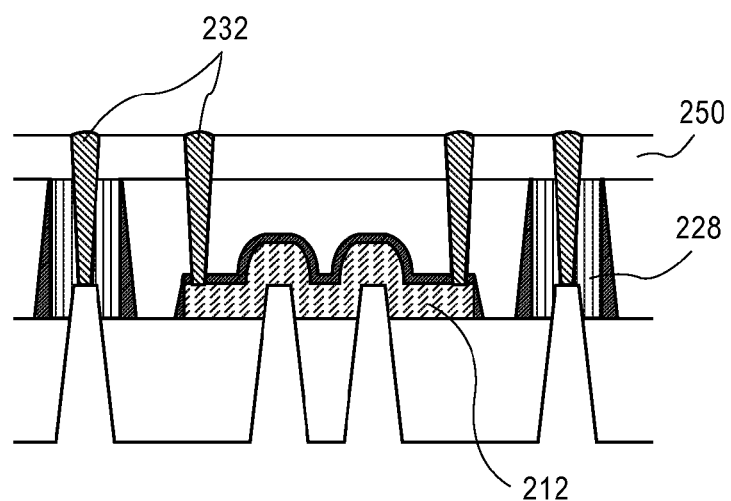

In a first fabrication approach, FIGS. 2A-2K illustrate cross-sectional views representing various operations in a method of fabricating a precision resistor for a non-planar semiconductor device architecture, in accordance with an embodiment of the present invention. Referring to FIG. 2A, an isolation layer 202 is formed on a patterned bulk substrate 204 and recessed to leave a plurality of fins 206 exposed. A first layer of polysilicon 208 and a silicon nitride hardmask 210 is then formed conformal with the plurality of fins 206, as depicted in FIG. 2B. Although not depicted, an insulating layer may first be formed on fins 206 to ultimately insulate polysilicon layer 208 from the fin material. Referring to FIG. 2C, a patterning process, e.g., a lithography and etch process, of the first layer of polysilicon 208 and the silicon nitride hardmask 210 is performed to provide a resistor structure 212. A second layer of polysilicon 214 is then formed above the resistor structure 212. The second layer of polysilicon 214 is planarized, e.g., by a chemical mechanical polishing process, and a second hardmask layer 216 is formed thereon, as depicted in FIG. 2D. Referring to FIG. 2E, a patterning process, e.g., a lithography and etch process, of the second layer of polysilicon 214 and the second hardmask 216 is performed to provide dummy gate structures 218, which may include spacers 220. The dummy gate structure 218 may then be masked by mask 222 and an implant process 224 is performed to resistor structure 212, as depicted in FIG. 2F, e.g., to provide desired resistance characteristics for resistor structure 212. Referring to FIG. 2G, mask 222 is removed and an inter-layer dielectric layer 226 (e.g., silicon oxide) is formed over the dummy gate structures 218 and the resistor structure 212. The inter-layer dielectric layer 226 is planarized to expose the polysilicon of the dummy gate structure 218, but to retain resistor structure 212 as un-exposed. The polysilicon of the dummy gate structures 218 is then removed, but the resistor structure 212 is retained, as depicted in FIG. 2H. Referring to FIG. 2I, permanent gate electrodes 228, e.g., metal gate electrodes (with, possibly, high-k gate dielectric layers), are formed. Additional inter-layer dielectric material 250 is formed and contact openings 230 are then formed to expose both the permanent gate electrodes 228 and the resistor structure 212 for electrical connection, as depicted in FIG. 2J. Although not shown, a silicidation process of the polysilicon of the resistor structure may be performed in the contact openings of the resistor, prior to formation of the contacts. Referring to FIG. 2K, contacts 232 are formed, e.g., by tungsten metal fill and polishing. The permanent gate structures 228 may be gate structures for a tri-gate device, while the resistor structure 212 may be a precision polysilicon resistor. The above approach may be referred to as a dual polysilicon deposition approach.

Figure 3A:
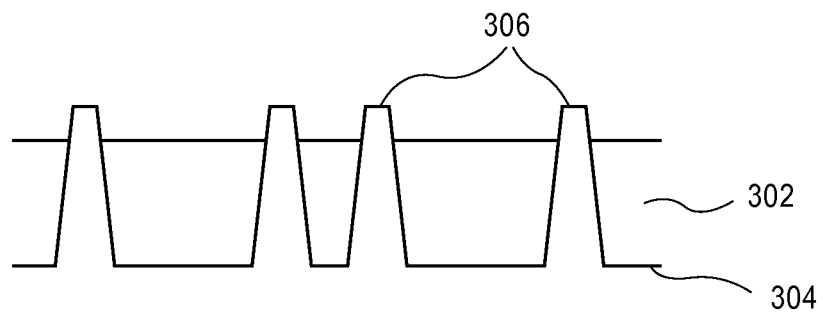
FIGS. 3A-3K illustrate cross-sectional views representing various operations in another method of fabricating a precision resistor for a non-planar semiconductor device architecture, in accordance with an embodiment of the present invention.
Figure 3B:
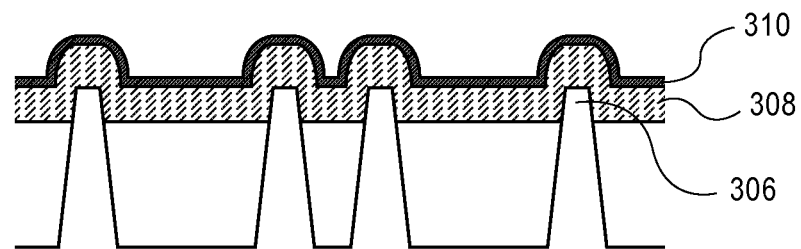
Figure 3C:
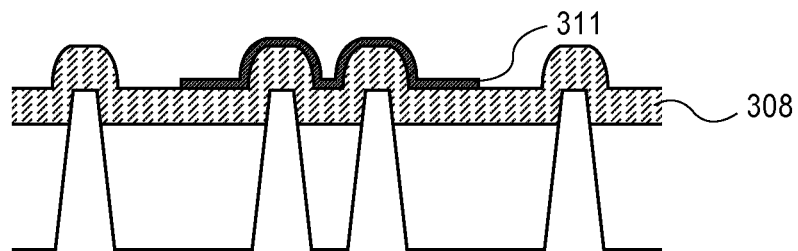
Figure 3D:
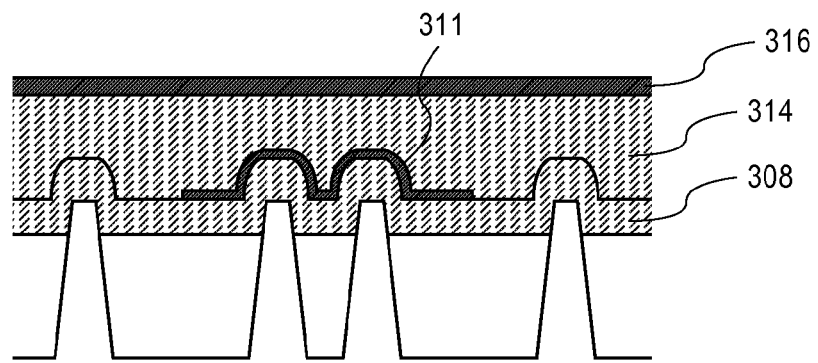
Figure 3E:
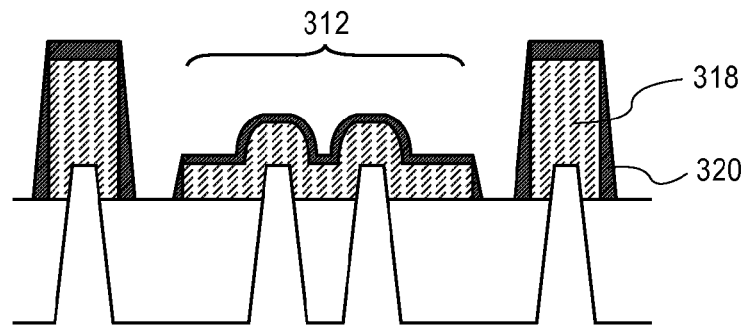
Figure 3F:
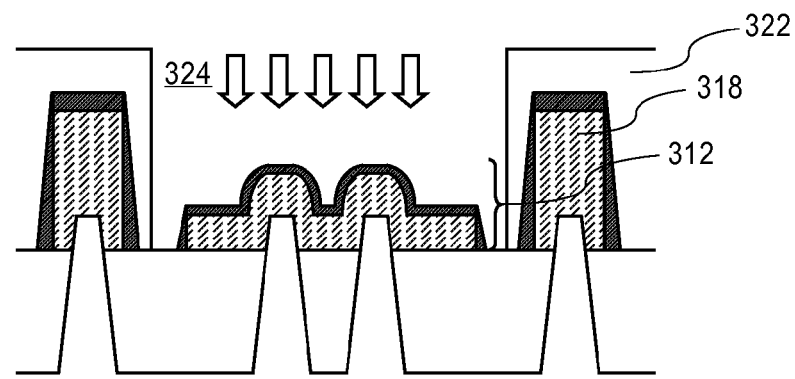
Figure 3G:
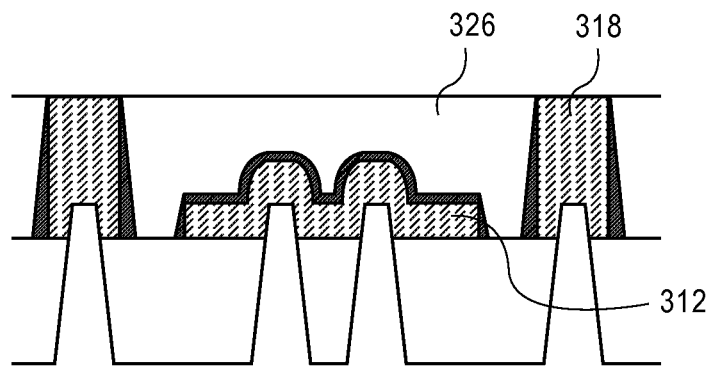
Figure 3H:
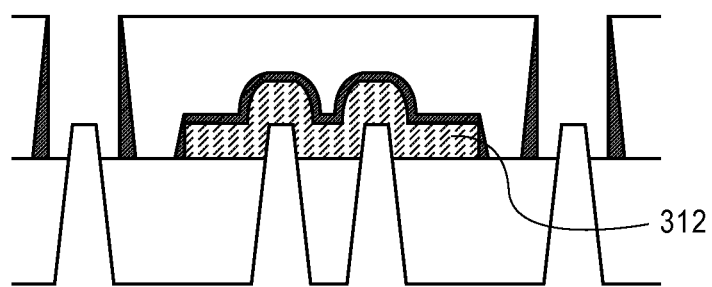
Figure 3I:
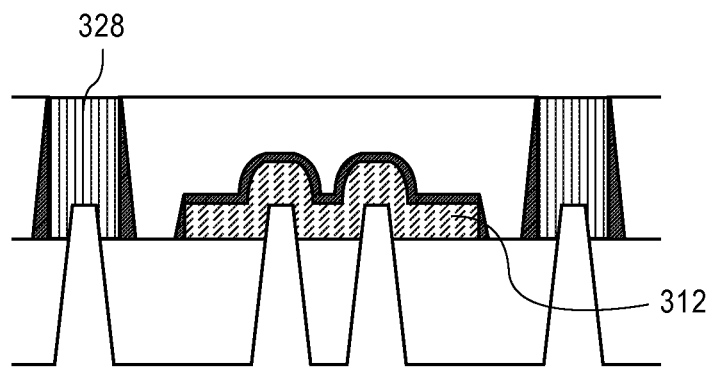
Figure 3J:
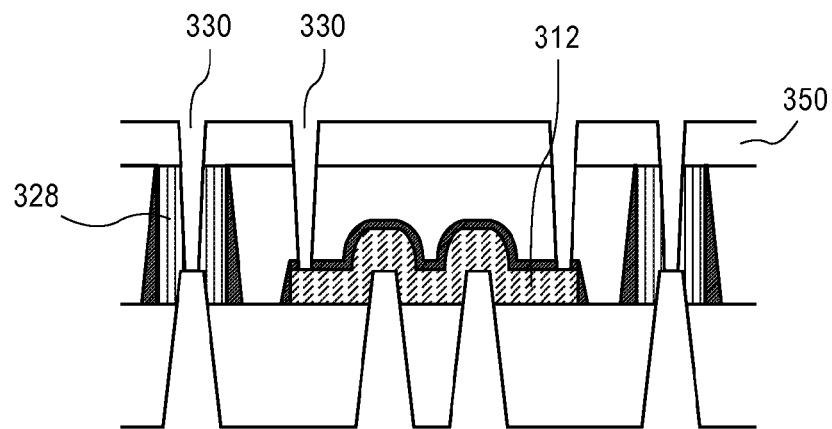
Figure 3K:
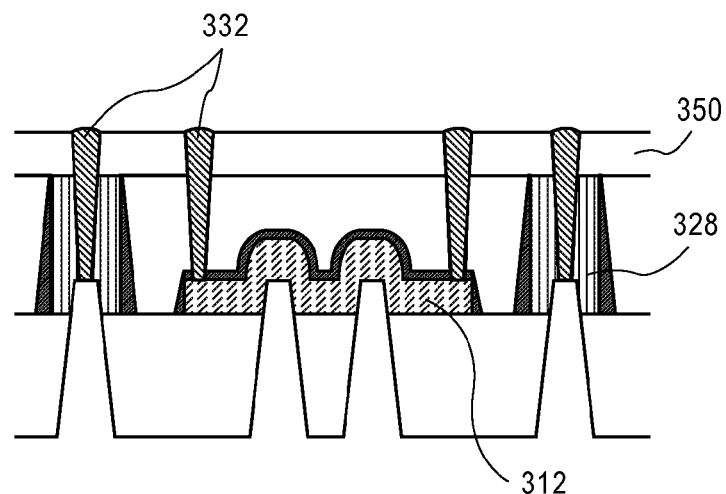

In a second fabrication approach, FIGS. 3A-3K illustrate cross-sectional views representing various operations in another method of fabricating a precision resistor for a non-planar semiconductor device architecture, in accordance with an embodiment of the present invention. Referring to FIG. 3A, an isolation layer 302 is formed on a patterned bulk substrate 304 and recessed to leave a plurality of fins 306 exposed. A first layer of polysilicon 308 and a silicon nitride hardmask 310 is then formed conformal with the plurality of fins 306, as depicted in FIG. 3B. Although not depicted, an insulating layer may first be formed on fins 306 to ultimately insulate polysilicon layer 308 from the fin material. Referring to FIG. 3C, a patterning process, e.g., a lithography and etch process, of the silicon nitride hardmask 310 is performed to provide a resistor mask 311. A second layer of polysilicon 314 is then formed above the resistor mask 311. The second layer of polysilicon 314 is planarized, e.g., by a chemical mechanical polishing process, and a second hardmask layer 316 is formed thereon, as depicted in FIG. 3D. Referring to FIG. 3E, a patterning process, e.g., a lithography and etch process, of the first layer of polysilicon 308, the second layer of polysilicon 314, and the second hardmask 316 is performed to provide dummy gate structures 318, which may include spacers 320, and to provide resistor structure 312. The dummy gate structure 318 may then be masked by mask 322 and an implant process 324 is performed to resistor structure 312, as depicted in FIG. 3F, e.g., to provide desired resistance characteristics for resistor structure 312. Referring to FIG. 3G, mask 322 is removed and an inter-layer dielectric layer 326 (e.g., silicon oxide) is formed over the dummy gate structures 318 and the resistor structure 312. The inter-layer dielectric layer 326 is planarized to expose the polysilicon of the dummy gate structure 318, but to retain resistor structure 312 as un-exposed. The polysilicon of the dummy gate structures 318 is then removed, but the resistor structure 312 is retained, as depicted in FIG. 3H. Referring to FIG. 3I, permanent gate electrodes 328, e.g., metal gate electrodes (with, possibly, high-k gate dielectric layers), are formed. Additional inter-layer dielectric material 350 is formed and contact openings 330 are then formed to expose both the permanent gate electrodes 328 and the resistor structure 312 for electrical connection, as depicted in FIG. 3J. Although not shown, a silicidation process of the polysilicon of the resistor structure may be performed in the contact openings of the resistor, prior to formation of the contacts. Referring to FIG. 3K, contacts 332 are formed, e.g., by tungsten metal fill and polishing. The permanent gate structures 328 may be gate structures for a tri-gate device, while the resistor structure 312 may be a precision polysilicon resistor. The above approach may be referred to as a buried hardmask stacked polysilicon resistor approach.

Figure 4A:
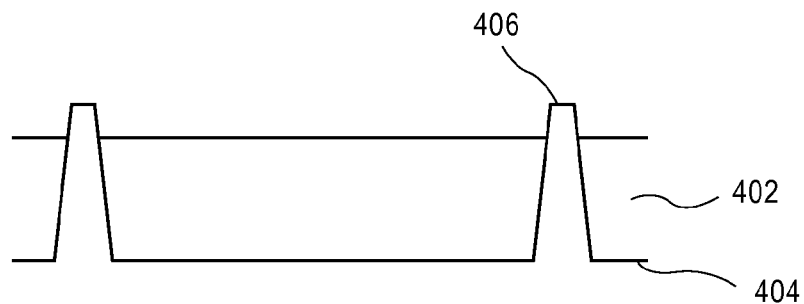
FIGS. 4A-4L illustrate cross-sectional views representing various operations in another method of fabricating a precision resistor for a non-planar semiconductor device architecture, in accordance with an embodiment of the present invention.
Figure 4B:
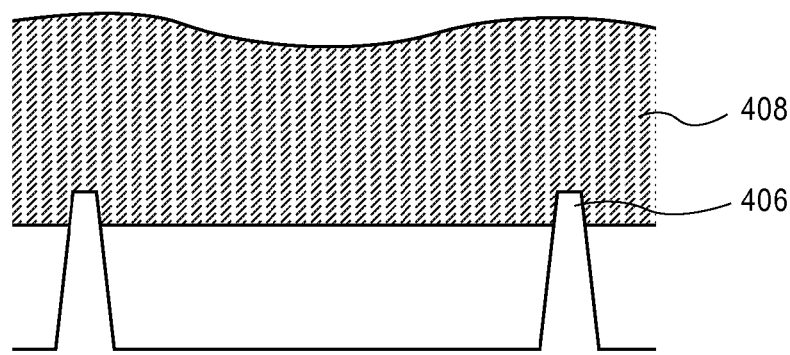
Figure 4C:
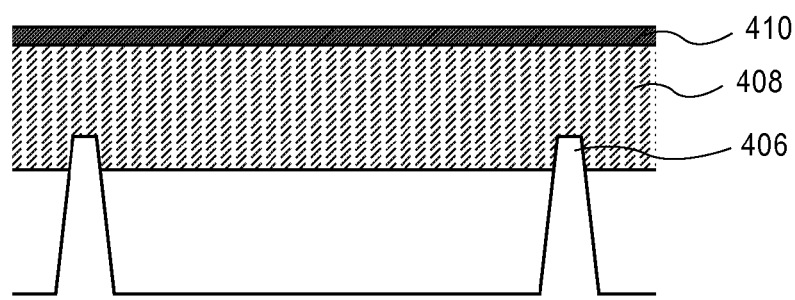
Figure 4D:
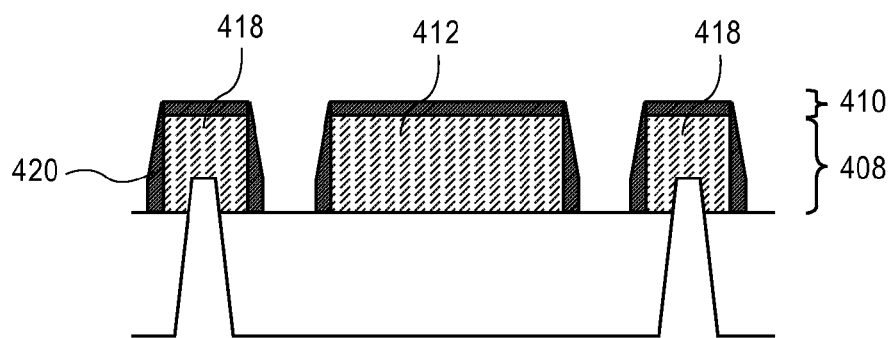
Figure 4E:
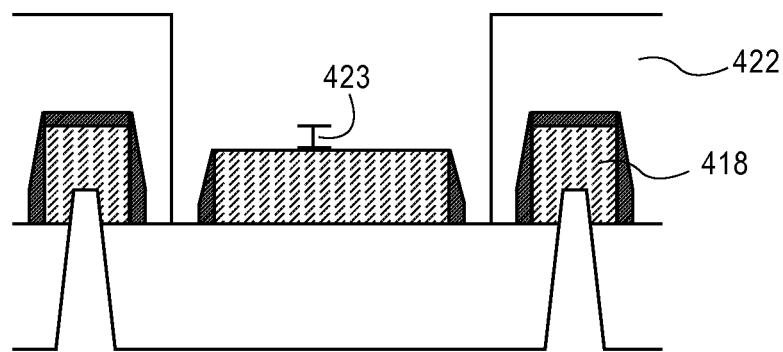
Figure 4F:
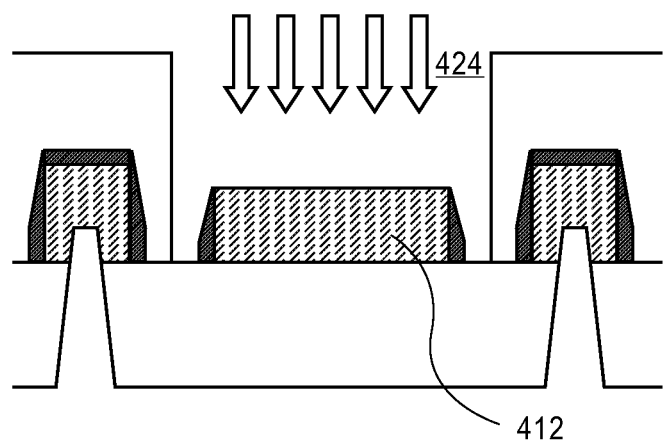
Figure 4G:
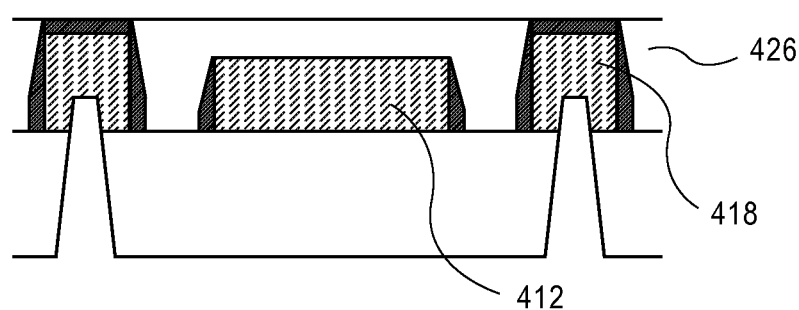
Figure 4H:
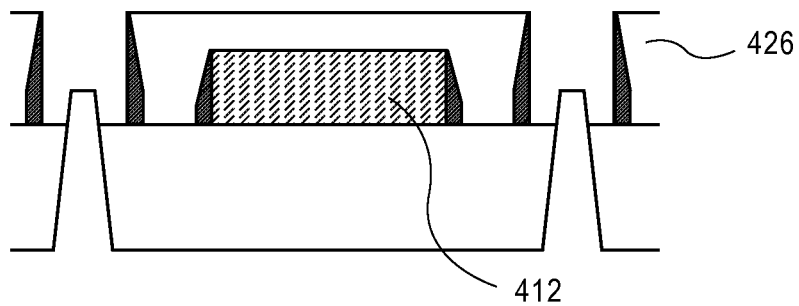
Figure 4I:
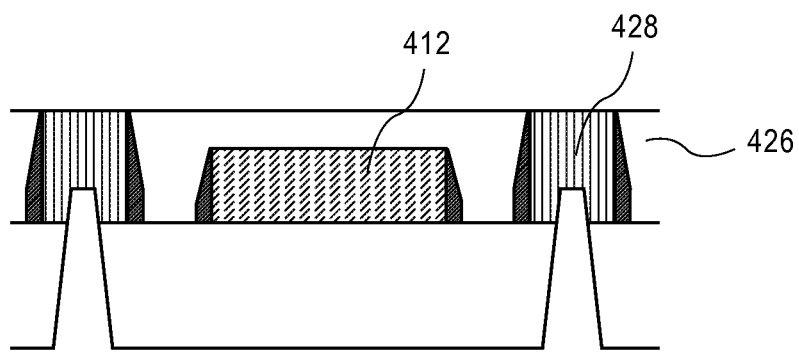
Figure 4J:
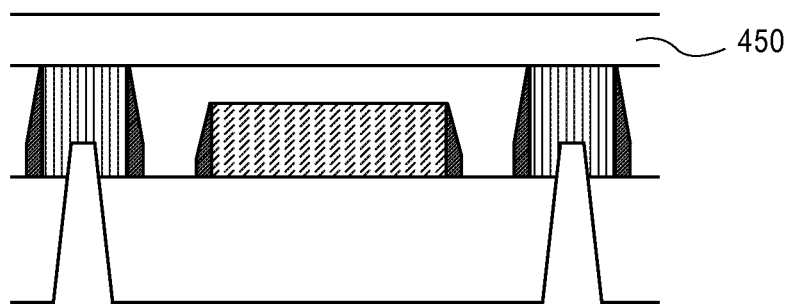
Figure 4K:
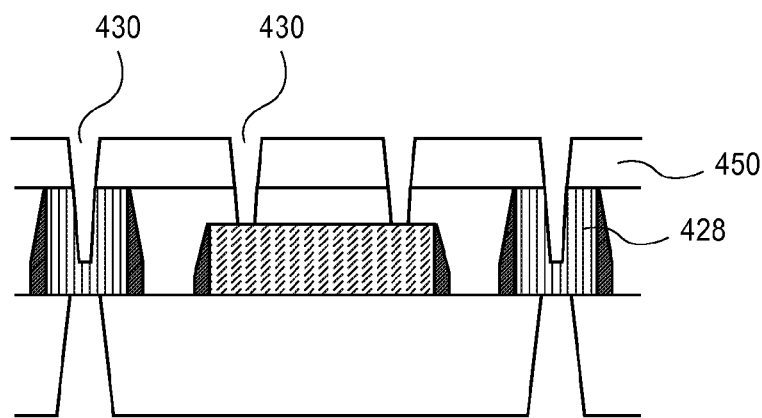
Figure 4L:
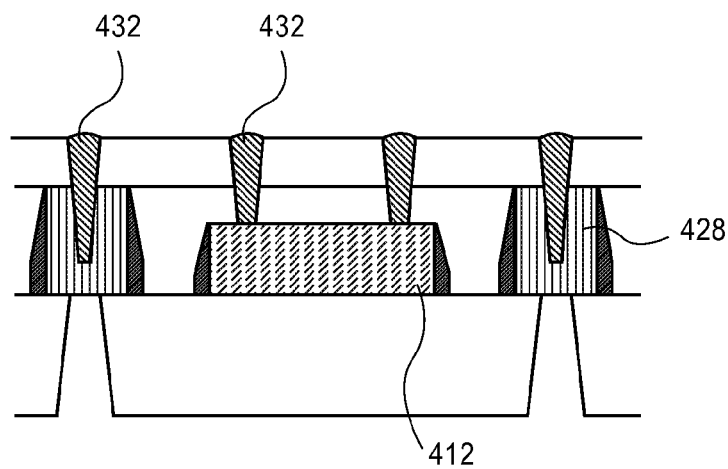

In a third fabrication approach, FIGS. 4A-4L illustrate cross-sectional views representing various operations in another method of fabricating a precision resistor for a non-planar semiconductor device architecture, in accordance with an embodiment of the present invention. Referring to FIG. 4A, an isolation layer 402 is formed on a patterned bulk substrate 404 and recessed to leave a plurality of fins 406 exposed. A layer of polysilicon 408 is then formed above the fins 406, as depicted in FIG. 4B. Although not depicted, an insulating layer may first be formed on fins 406 to ultimately insulate polysilicon layer 408 from the fin material. Referring to FIG. 4C, the layer of polysilicon 408 is planarized, e.g., by a chemical mechanical planarization process, and a silicon nitride hardmask 410 is then formed. A patterning process, e.g., a lithography and etch process, of the silicon nitride hardmask 410 and the layer of polysilicon 408 is then performed to provide dummy gate structures 418 and a resistor structure 412, which may include spacers 420, as depicted in FIG. 4D. Referring to FIG. 4E, the dummy gate structure 418 may then be masked by mask 422. The exposed resistor structure 412 is then recessed, e.g., by an etch process. The recessing 423, in one embodiment, involved removal of the hardmask as well as a portion of the polysilicon layer. An implant process 424 is performed to resistor structure 412, as depicted in FIG. 4F, e.g., to provide desired resistance characteristics for resistor structure 412. Referring to FIG. 4G, mask 422 is removed and an inter-layer dielectric layer 426 (e.g., silicon oxide) is formed over the dummy gate structures 418 and the resistor structure 412. The inter-layer dielectric layer 426 is planarized to expose the polysilicon of the dummy gate structure 418, but to retain resistor structure 412 as un-exposed. The polysilicon of the dummy gate structures 418 is then removed, but the resistor structure 412 is retained, as depicted in FIG. 4H. Referring to FIG. 4I, permanent gate electrodes 428, e.g., metal gate electrodes (with, possibly, high-k gate dielectric layers), are formed. Additional inter-layer dielectric material 450 is then formed, as depicted in FIG. 4J. Referring to 4K, contact openings 430 are then formed to expose both the permanent gate electrodes 428 and the resistor structure 412 for electrical connection. Although not shown, a silicidation process of the polysilicon of the resistor structure may be performed in the contact openings of the resistor, prior to formation of the contacts. Contacts 432 are then formed, e.g., by tungsten metal fill and polishing, as depicted in FIG. 4L. The permanent gate structures 428 may be gate structures for a tri-gate device, while the resistor structure 412 may be a precision polysilicon resistor. The above approach may be referred to as a recessed polysilicon resistor approach.

Figure 5A:
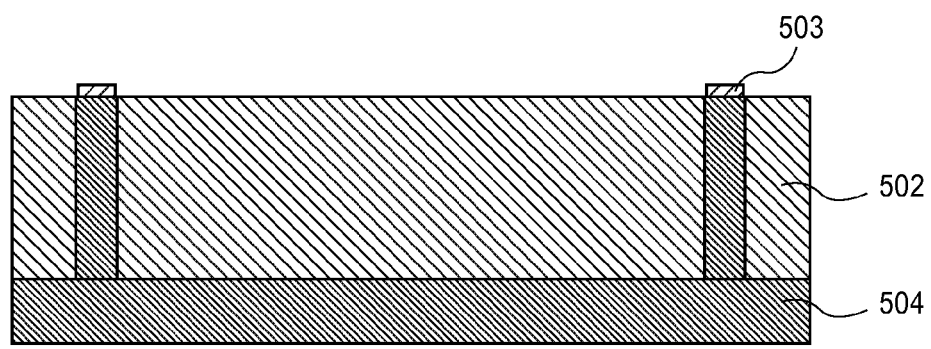
FIGS. 5A-5F illustrate cross-sectional views representing various operations in another method of fabricating a precision resistor for a non-planar semiconductor device architecture, in accordance with an embodiment of the present invention.
Figure 5B:
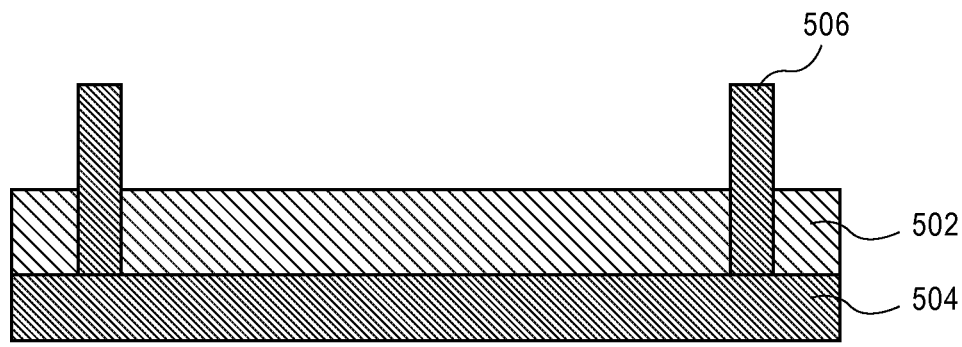
Figure 5C:
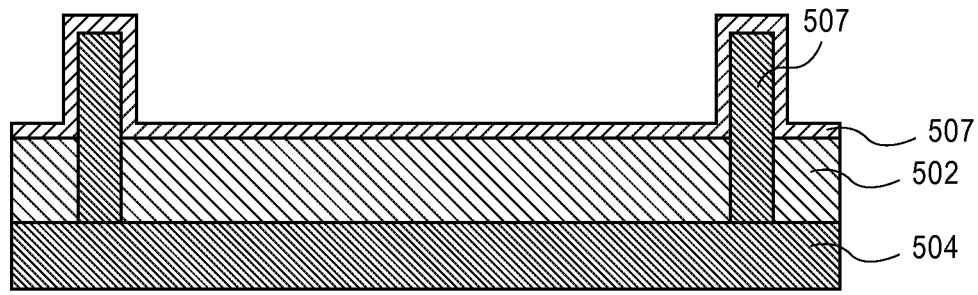
Figure 5D:
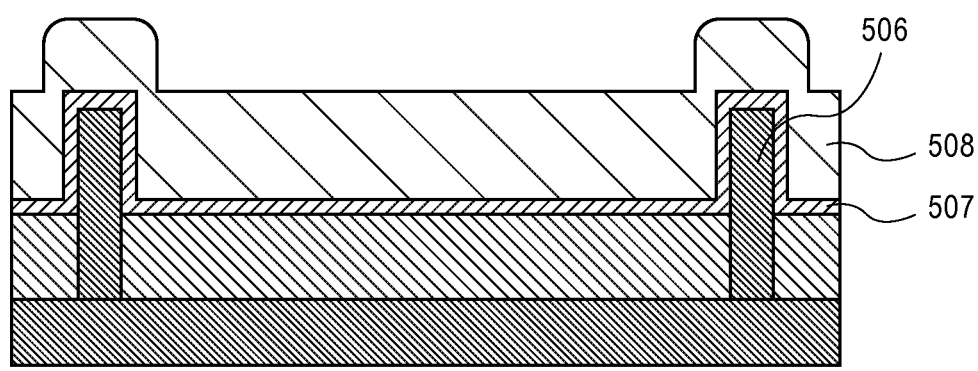
Figure 5E:
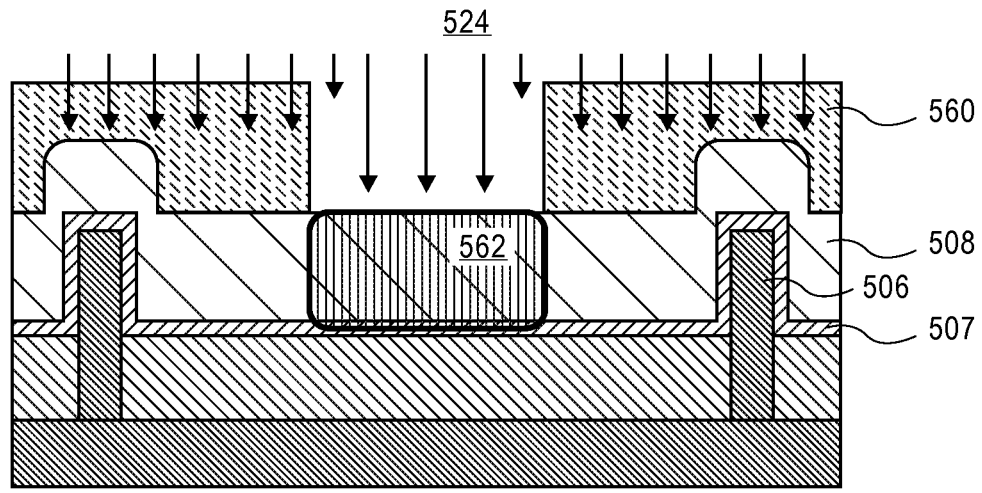
Figure 5F:
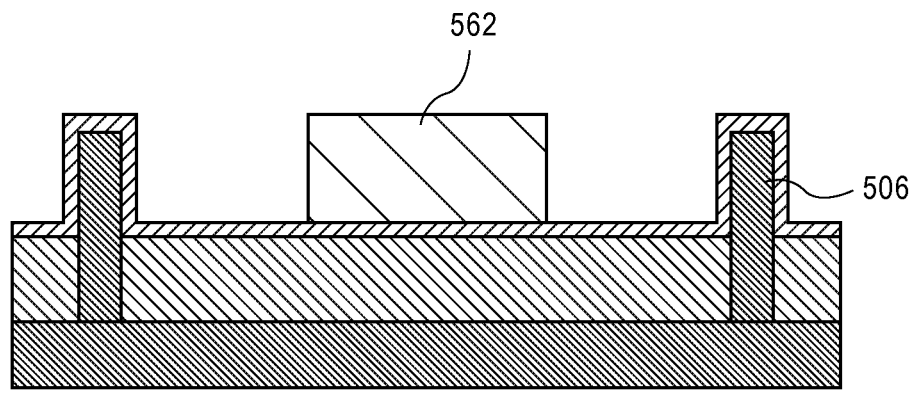

In a fourth fabrication approach, FIGS. 5A-5F illustrate cross-sectional views representing various operations in another method of fabricating a precision resistor for a non-planar semiconductor device architecture, in accordance with an embodiment of the present invention. Referring to FIG. 5A, an isolation layer 502 is formed on a patterned bulk substrate 504 with hardmask portions 503 protruding there from. The isolation layer 502 is recessed to leave a plurality of fins 506 exposed, e.g., at a height of approximately 45 nanometers above the isolation layer 502, as depicted in FIG. 5B. Referring to FIG. 5C, a protective oxide layer 507 is formed conformal with the fins 506, e.g., by chemical vapor deposition of a silicon oxide layer. A layer of polysilicon 508 is then formed above the protective oxide layer 507, as depicted in FIG. 5D. In one embodiment, the protective oxide layer 507 has a thickness of approximately 2.5 nanometers and the layer of polysilicon 508 has a thickness of approximately 40 nanometers. Referring to FIG. 5E, a photoresist layer 560 is formed and patterned above the layer of polysilicon 508, leaving exposed a region of the layer of polysilicon 508 between fins 506. An implant process 524, such as a high dose p+ implant process, is performed to provide a doped polysilicon region 562, as is also depicted in FIG. 5E. Referring to FIG. 5F, the photoresist layer 560 is removed and the undoped portion of the polysilicon layer 508 are removed, e.g., by a selective wet etch process such as tetramethylammonium hydroxide (TMAH). The remaining doped polysilicon region 562 may subsequently be used to form a precision resistor. The above approach may be referred to as a selectively implanted polysilicon resistor approach.

Regarding approaches of the type (II) above, in an embodiment, a hardmask is used to modify polish behavior during a poly opening polish to prevent a desired resistor area from being exposed (and, subsequently, removed). The protected polysilicon is then salicided and electrically connected to source/drain contacts.

Figure 6A:
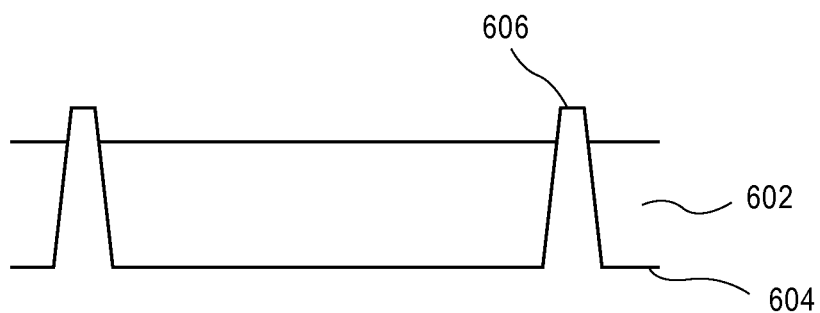
FIGS. 6A-6L illustrate cross-sectional views representing various operations in another method of fabricating a precision resistor for a non-planar semiconductor device architecture, in accordance with an embodiment of the present invention.
Figure 6B:
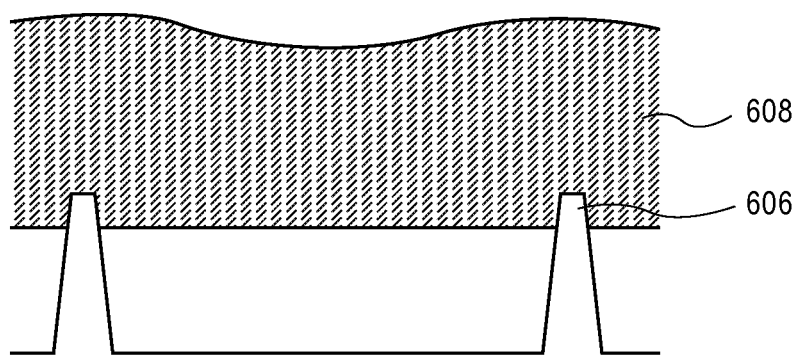
Figure 6C:
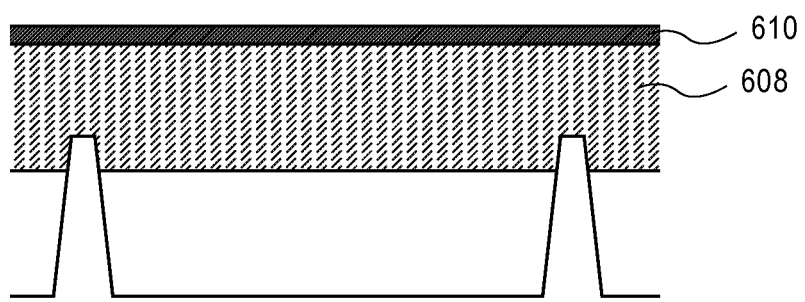
Figure 6D:
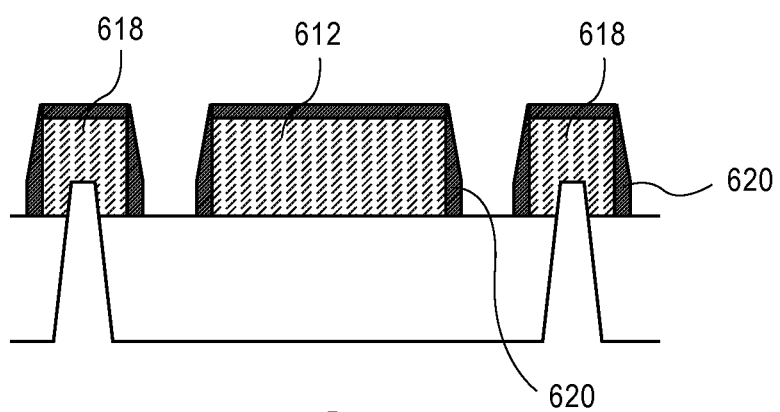
Figure 6E:
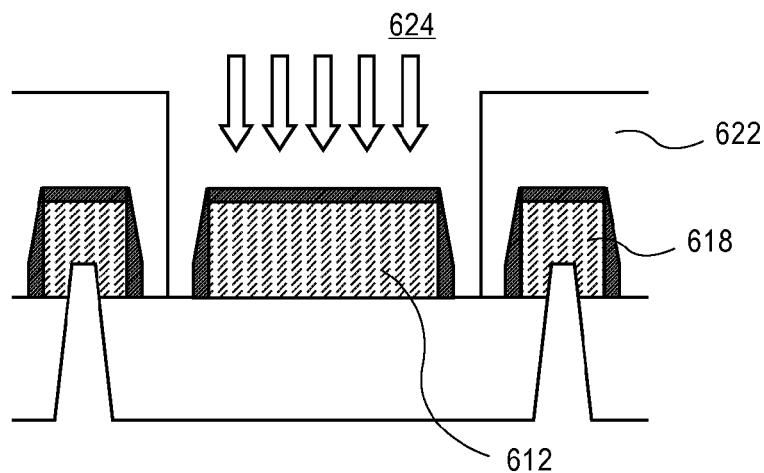
Figure 6F:
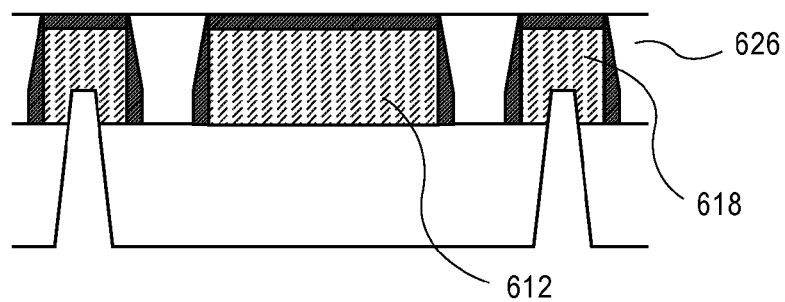
Figure 6G:
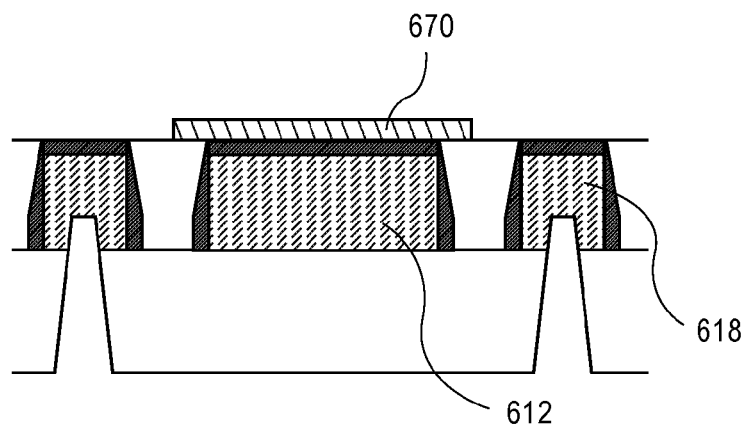
Figure 6H:
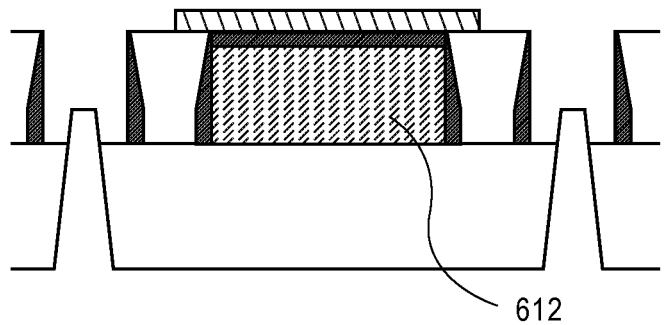
Figure 6I:
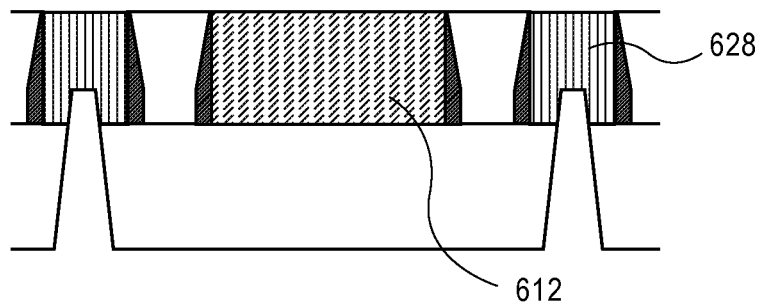
Figure 6J:
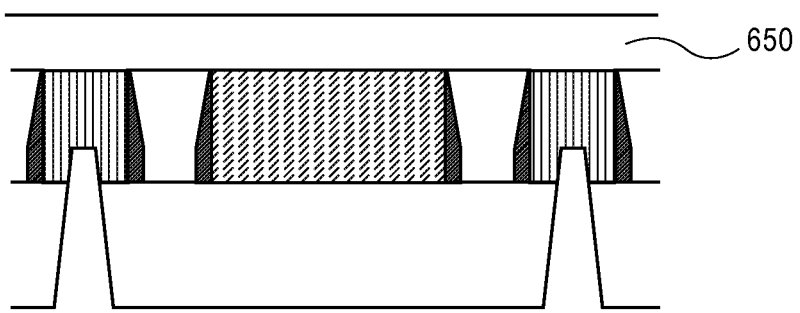
Figure 6K:
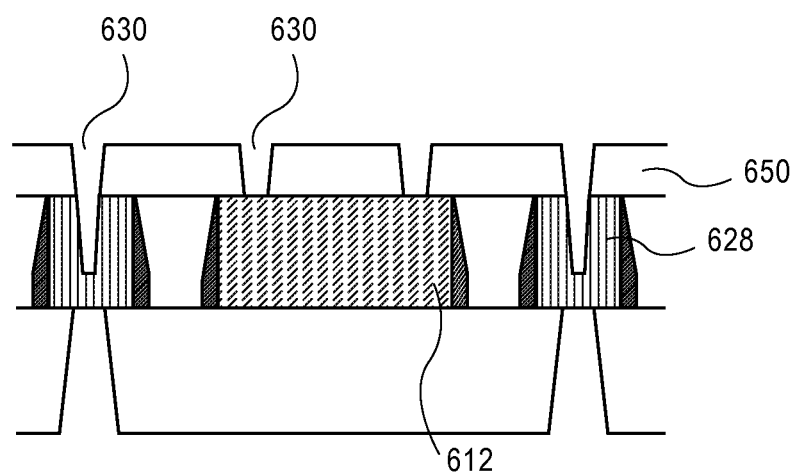
Figure 6L:
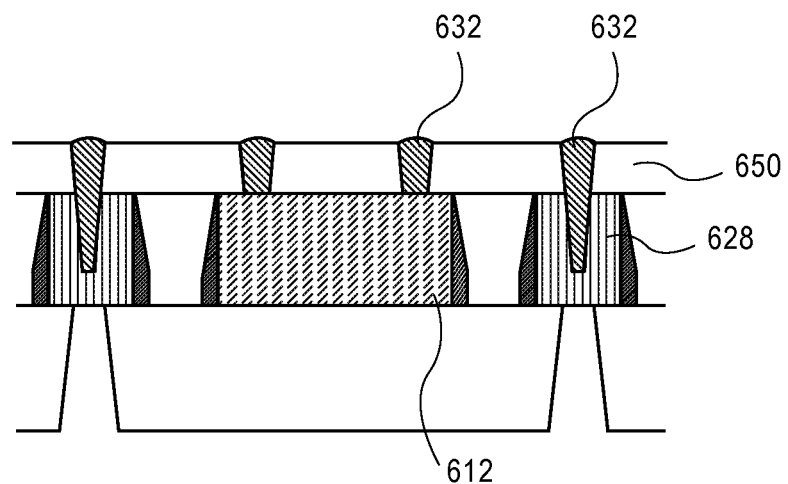

In a fifth fabrication approach, FIGS. 6A-6L illustrate cross-sectional views representing various operations in another method of fabricating a precision resistor for a non-planar semiconductor device architecture, in accordance with an embodiment of the present invention. Referring to FIG. 6A, an isolation layer 602 is formed on a patterned bulk substrate 604 and recessed to leave a plurality of fins 606 exposed. A layer of polysilicon 608 is then formed above the fins 606, as depicted in FIG. 6B. Although not depicted, an insulating layer may first be formed on fins 606 to ultimately insulate polysilicon layer 608 from the fin material. Referring to FIG. 6C, the layer of polysilicon 608 is planarized, e.g., by a chemical mechanical planarization process, and a silicon nitride hardmask 610 is then formed. A patterning process, e.g., a lithography and etch process, of the silicon nitride hardmask 610 and the layer of polysilicon 608 is then performed to provide dummy gate structures 618 and a resistor structure 612, which may include spacers 620, as depicted in FIG. 6D. Referring to FIG. 6E, the dummy gate structure 618 may then be masked by mask 622. The exposed resistor structure 612 is then subjected to an implant process 624, e.g., to provide desired resistance characteristics for resistor structure 612. Mask 622 is removed and an inter-layer dielectric layer 626 (e.g., silicon oxide) is formed and planarized over the dummy gate structures 618 and the resistor structure 612, as depicted in FIG. 6F. Referring to FIG. 6G, a second hardmask layer 670 is formed and patterned to cover resistor structure 612 but to expose dummy gate structures 618. The polysilicon of the dummy gate structures 618 is then removed, but the resistor structure 612 is retained, as depicted in FIG. 6H. Referring to FIG. 6I, permanent gate electrodes 628, e.g., metal gate electrodes (with, possibly, high-k gate dielectric layers), are formed. Additional inter-layer dielectric material 650 is then formed, as depicted in FIG. 6J. Referring to 6K, contact openings 630 are then formed to expose both the permanent gate electrodes 628 and the resistor structure 612 for electrical connection. Contacts 632 are then formed, e.g., by tungsten metal fill and polishing, as depicted in FIG. 6L. Although not shown, a silicidation process of the polysilicon of the resistor structure may be performed in the contact openings of the resistor, prior to formation of the contacts. The permanent gate structures 628 may be gate structures for a tri-gate device, while the resistor structure 612 may be a precision polysilicon resistor.

In the above described approaches, an exposed plurality of dummy gates may ultimately be replaced in a replacement gate process scheme. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing.

In an embodiment, the plurality of dummy gates is removed by a dry etch or wet etch process. In one embodiment, the plurality of dummy gates is composed of polycrystalline silicon or amorphous silicon and is removed with a dry etch process comprising $SF_6$. In another embodiment, the plurality of dummy gates is composed of polycrystalline silicon or amorphous silicon and is removed with a wet etch process comprising aqueous $NH_4OH$ or tetramethylammonium hydroxide. In one embodiment, the plurality of dummy gates is composed of silicon nitride and is removed with a wet etch comprising aqueous phosphoric acid.

Perhaps more generally, one or more embodiments of the present invention may be directed to a gate aligned contact process. Such a process may be implemented to form contact structures for semiconductor structure fabrication, e.g., for integrated circuit fabrication. In an embodiment, a contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separately patterning of contacts and contact plugs.

Figure 7:
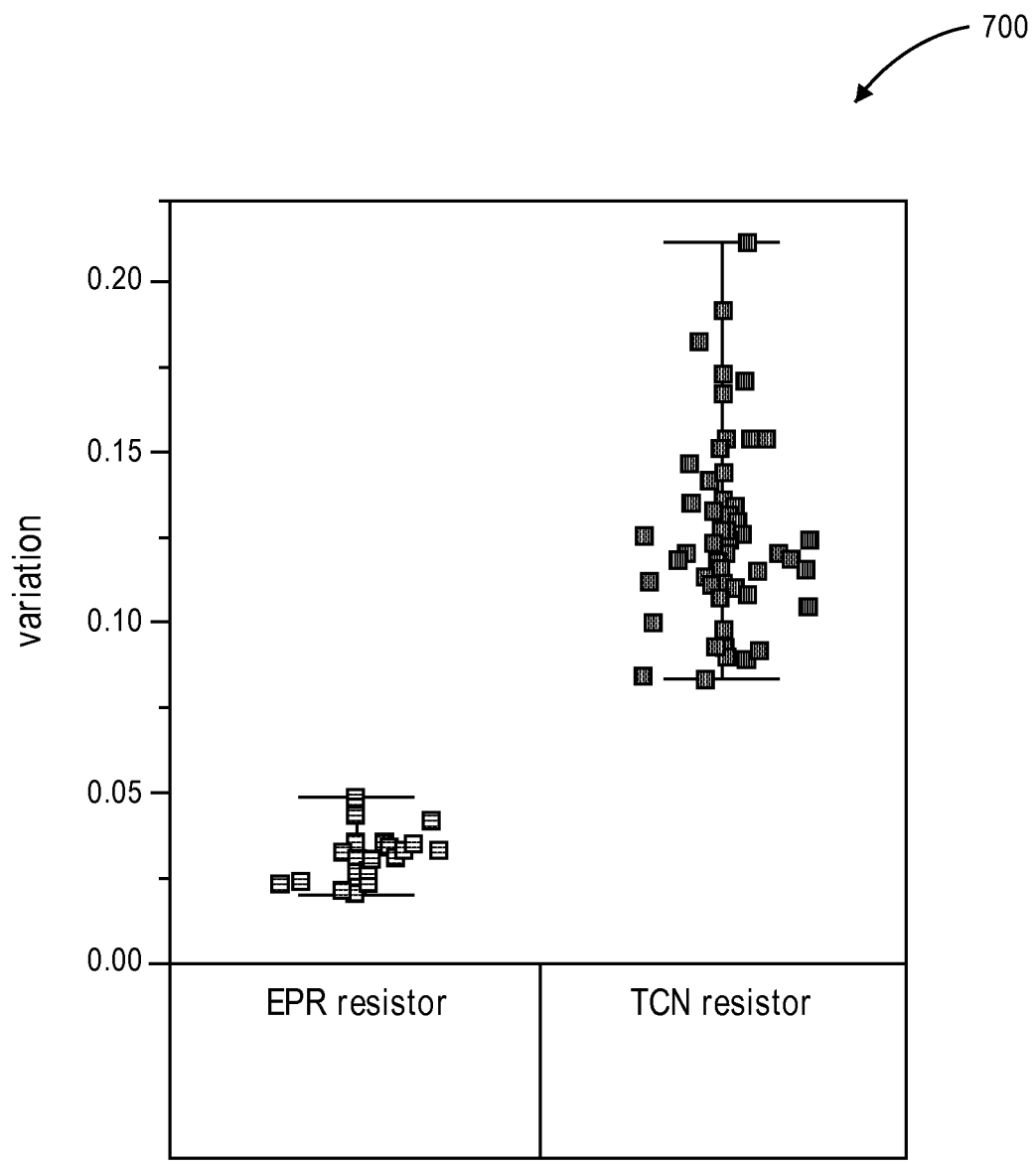
FIG. 7 is a plot provided to demonstrate the variation of presently described precision resistors versus their tungsten trench counterparts, in accordance with an embodiment of the present invention.

Referring to FIG. 7, a plot 700 is provided to demonstrate the variation of presently described precision resistors versus their tungsten trench counterparts, in accordance with an embodiment. Referring to plot 700, present resistors (EPR) show significantly less resistance variation the tungsten trench resistors (TCN). That is, the resistance variation is substantially reduced, enabling more accurate and tighter analog designs, for the presently described resistors.

Embodiments described herein may be applicable to designs requiring a resistor with a predictable and consistent resistance value. Current tungsten trench resistors may have large resistance and temperature variations, requiring margin to be built into a circuit. By contrast, in an embodiment, precision resistors described herein enable a simpler, smaller circuit design and footprint, along with superior matching and variability. Such characteristics may be of particular concern to analog circuit designers. The precision resistor may also be an integral collateral for system-on-chip (SoC) designers.

Figure 8:
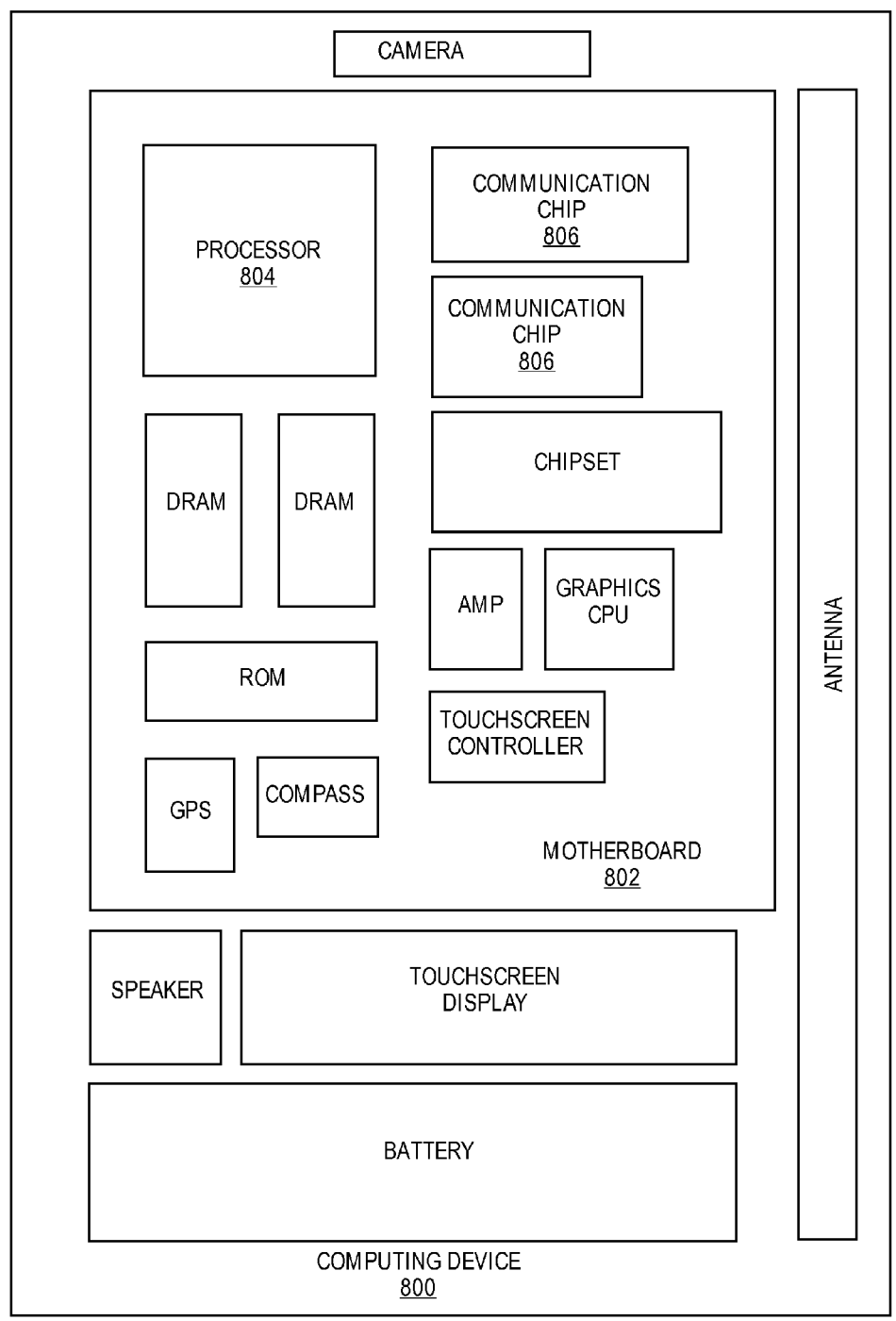
FIG. 8 illustrates a computing device in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as precision resistors for non-planar semiconductor device architectures built in accordance with implementations of the invention.

In further implementations, another component housed within the computing device 800 may contain an integrated circuit die that includes one or more devices, such as precision resistors for non-planar semiconductor device architectures built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, embodiments of the present invention include precision resistors for non-planar semiconductor device architectures and methods of fabricating precision resistors for non-planar semiconductor device architectures.

In an embodiment, a semiconductor structure includes first and second semiconductor fins disposed above a substrate. A resistor structure is disposed above the first semiconductor fin but not above the second semiconductor fin. A transistor structure is formed from the second semiconductor fin but not from the first semiconductor fin.

In one embodiment, the resistor structure includes a resistive material layer disposed conformal with the first semiconductor fin.

In one embodiment, the resistive material layer is composed of polycrystalline silicon.

In one embodiment, the polycrystalline silicon has a grain size of approximately 20 nanometers.

In one embodiment, the polycrystalline silicon is doped with boron with a dose approximately in the range of 1E15-1E17 atoms/cm$^2$.

In one embodiment, the resistive material layer has a resistance that is essentially independent of temperature over a working temperature range of the resistor structure.

In one embodiment, the semiconductor structure further includes an electrically insulating layer disposed between the resistive material layer and the first semiconductor fin.

In one embodiment, the resistor structure includes tungsten metal contacts coupled to nickel silicide regions disposed in the polycrystalline silicon.

In one embodiment, the transistor structure includes source and drain regions disposed in the second semiconductor fin, and a gate stack disposed above the second semiconductor fin, and the gate stack includes a high-k gate dielectric layer and a metal gate electrode.

In one embodiment, the first semiconductor fin is of a first plurality of semiconductor fins and the second semiconductor fin is of a second plurality of semiconductor fins, the resistor structure is disposed above the first plurality of semiconductor fins but not above the second plurality of semiconductor fins, and the transistor structure is formed from the second plurality of semiconductor fins but not from the first plurality of semiconductor fins.

In one embodiment, the first and second pluralities of semiconductor fins are electrically coupled to an underlying bulk semiconductor substrate.

In one embodiment, the resistor structure is a non-planar resistor structure.

In another embodiment, a semiconductor structure includes first and second semiconductor fins disposed above a substrate. An isolation region is disposed above the substrate, between the first and second semiconductor fins, and at a height less than the first and second semiconductor fins. A resistor structure is disposed above the isolation region but not above the first and second semiconductor fins. First and second transistor structures are formed from the first and second semiconductor fins, respectively.

In one embodiment, the resistor structure includes a resistive material layer disposed conformal with the isolation region.

In one embodiment, the resistive material layer is composed of polycrystalline silicon.

In one embodiment, the polycrystalline silicon has a grain size of approximately 20 nanometers.

In one embodiment, the polycrystalline silicon is doped with boron with a dose approximately in the range of 1E15-1E17 atoms/cm$^2$.

In one embodiment, the resistive material layer has a resistance that is essentially independent of temperature over a working temperature range of the resistor structure.

In one embodiment, the resistive material layer has a top surface at a height less than the heights of the first and second semiconductor fins.

In one embodiment, the resistor structure includes tungsten metal contacts coupled to nickel silicide regions disposed in the polycrystalline silicon.

In one embodiment, the first and second transistor structures each includes source and drain regions disposed in the first or second semiconductor fin, respectively, and a gate stack disposed above the first and second semiconductor fin, respectively. Each gate stack includes a high-k gate dielectric layer and a metal gate electrode.

In one embodiment, the first semiconductor fin is of a first plurality of semiconductor fins and the second semiconductor fin is of a second plurality of semiconductor fins, and the first transistor structure is formed from the first plurality of semiconductor fins and the second transistor structure is formed from the second plurality of semiconductor fins.

In one embodiment, the first and second pluralities of semiconductor fins are electrically coupled to an underlying bulk semiconductor substrate.

In one embodiment, the resistor structure is a planar resistor structure.

In an embodiment, a method of fabricating a semiconductor structure includes forming first and second semiconductor fins above a substrate. The method also includes forming a resistor structure above the first semiconductor fin but not above the second semiconductor fin. The method also includes forming a transistor structure from the second semiconductor fin but not from the first semiconductor fin. Forming the transistor structure includes forming one or more dummy gates above the second semiconductor fin and, subsequent to forming the resistor structure, replacing the one or more dummy gates with a permanent gate stack.

In one embodiment, forming the resistor structure includes forming a resistive material layer conformal with the first semiconductor fin.

In one embodiment, forming the resistive material layer includes forming a polycrystalline silicon layer having a grain size of approximately 20 nanometers.

In an embodiment, a method of fabricating a semiconductor structure includes forming first and second semiconductor fins above a substrate. The method also includes forming an isolation region above the substrate, between the first and second semiconductor fins, and at a height less than the first and second semiconductor fins. The method also includes forming a resistor structure above the isolation region but not above the first and second semiconductor fins. The method also includes forming first and second transistor structures from the first and second semiconductor fins, respectively. Forming the first and second transistor structures includes forming one or more dummy gates above the first and second semiconductor fins and, subsequent to forming the resistor structure, replacing the one or more dummy gates with a permanent gate stack.

In one embodiment, forming the resistor structure includes forming a resistive material layer conformal with the isolation region.

In one embodiment, forming the resistive material layer includes forming a polycrystalline silicon layer having a grain size of approximately 20 nanometers.

What is claimed is:

1. A semiconductor structure, comprising:
   first and second semiconductor fins disposed above a substrate;
   a resistor structure disposed above the first semiconductor fin but not above the second semiconductor fin; and
   a transistor structure formed from the second semiconductor fin but not from the first semiconductor fin.

2. The semiconductor structure of claim 1, wherein the resistor structure comprises a resistive material layer disposed conformal with the first semiconductor fin.

3. The semiconductor structure of claim 2, wherein the resistive material layer comprises polycrystalline silicon.

4. The semiconductor structure of claim 3, wherein the polycrystalline silicon has a grain size of approximately 20 nanometers.

5. The semiconductor structure of claim 4, wherein the polycrystalline silicon is doped with boron with a dose approximately in the range of 1E15-1E17 atoms/cm$^2$.

6. The semiconductor structure of claim 3, wherein the resistor structure comprises tungsten metal contacts coupled to nickel silicide regions disposed in the polycrystalline silicon.

7. The semiconductor structure of claim 2, wherein the resistive material layer has a resistance that is essentially independent of temperature over a working temperature range of the resistor structure.

8. The semiconductor structure of claim 2, further comprising:
   an electrically insulating layer disposed between the resistive material layer and the first semiconductor fin.

9. The semiconductor structure of claim 1, wherein the transistor structure comprises source and drain regions disposed in the second semiconductor fin, and a gate stack disposed above the second semiconductor fin, and wherein the gate stack comprises a high-k gate dielectric layer and a metal gate electrode.

10. The semiconductor structure of claim 1, wherein the first semiconductor fin is of a first plurality of semiconductor fins and the second semiconductor fin is of a second plurality of semiconductor fins, wherein the resistor structure is disposed above the first plurality of semiconductor fins but not above the second plurality of semiconductor fins, and wherein the transistor structure is formed from the second plurality of semiconductor fins but not from the first plurality of semiconductor fins.

11. The semiconductor structure of claim 10, wherein the first and second pluralities of semiconductor fins are electrically coupled to an underlying bulk semiconductor substrate.

12. The semiconductor structure of claim 1, wherein the resistor structure is a non-planar resistor structure.

13. A semiconductor structure, comprising:
   first and second semiconductor fins disposed above a substrate;
   an isolation region disposed above the substrate, between the first and second semiconductor fins, and at a height less than the first and second semiconductor fins;
   a resistor structure disposed above the isolation region but not above the first and second semiconductor fins; and
   first and second transistor structures formed from the first and second semiconductor fins, respectively.

14. The semiconductor structure of claim 13, wherein the resistor structure comprises a resistive material layer disposed conformal with the isolation region.

15. The semiconductor structure of claim 14, wherein the resistive material layer comprises polycrystalline silicon.

16. The semiconductor structure of claim 15, wherein the polycrystalline silicon has a grain size of approximately 20 nanometers.

17. The semiconductor structure of claim 16, wherein the polycrystalline silicon is doped with boron with a dose approximately in the range of 1E15-1E17 atoms/cm$^2$.

18. The semiconductor structure of claim 14, wherein the resistive material layer has a resistance that is essentially independent of temperature over a working temperature range of the resistor structure.

19. The semiconductor structure of claim 14, wherein the resistive material layer has a top surface at a height less than the heights of the first and second semiconductor fins.

20. The semiconductor structure of claim 15, wherein the resistor structure comprises tungsten metal contacts coupled to nickel silicide regions disposed in the polycrystalline silicon.

21. The semiconductor structure of claim 13, wherein the first and second transistor structures each comprises source and drain regions disposed in the first or second semiconductor fin, respectively, and a gate stack disposed above the first and second semiconductor fin, respectively, and wherein the gate stack comprises a high-k gate dielectric layer and a metal gate electrode.

22. The semiconductor structure of claim 13, wherein the first semiconductor fin is of a first plurality of semiconductor fins and the second semiconductor fin is of a second plurality of semiconductor fins, and wherein the first transistor structure is formed from the first plurality of semiconductor fins and the second transistor structure is formed from the second plurality of semiconductor fins.

23. The semiconductor structure of claim 22, wherein the first and second pluralities of semiconductor fins are electrically coupled to an underlying bulk semiconductor substrate.

24. The semiconductor structure of claim 13, wherein the resistor structure is a planar resistor structure.

\* \* \* \* \*